United States Patent
Tornstrom et al.

[11] Patent Number: 5,110,369
[45] Date of Patent: May 5, 1992

[54] CABLE INTERCONNECTIONS FOR SOLAR CELL MODULES

[75] Inventors: Eric Tornstrom, Acton, Mass.; Anthony J. Norbedo, Gaithersberg, Md.

[73] Assignee: Mobil Solar Energy Corporation, Billerica, Mass.

[21] Appl. No.: 603,886

[22] Filed: Oct. 24, 1990

[51] Int. Cl.⁵ .................................... H01L 31/05
[52] U.S. Cl. .................................. 136/251; 136/244
[58] Field of Search .................. 136/244, 251, 259

[56] References Cited

U.S. PATENT DOCUMENTS

| | | | |
|---|---|---|---|
| 3,982,963 | 9/1976 | Mahoney et al. | 136/251 |
| 4,049,335 | 9/1977 | Julian et al. | 339/224 |
| 4,097,308 | 6/1978 | Klein et al. | 136/251 |
| 4,131,123 | 12/1978 | Della-Vedowa et al. | 136/251 |
| 4,152,824 | 5/1979 | Gonsiorawski | 437/2 |
| 4,167,644 | 9/1979 | Kurth et al. | 136/251 |
| 4,239,555 | 12/1980 | Scharlack et al. | 136/251 |
| 4,325,760 | 4/1982 | Julian et al. | 156/49 |
| 4,371,739 | 2/1983 | Lewis et al. | 136/251 |
| 4,433,200 | 2/1984 | Jester et al. | 136/251 |
| 4,451,969 | 6/1984 | Chaudhuri | 437/2 |
| 4,457,578 | 7/1984 | Taylor | 439/801 |
| 4,751,191 | 6/1988 | Gonsiorawski et al. | 437/2 |

FOREIGN PATENT DOCUMENTS

| | | | |
|---|---|---|---|
| 3047399 | 7/1982 | Fed. Rep. of Germany | 136/251 |
| 57-162473 | 10/1982 | Japan | 136/251 |

OTHER PUBLICATIONS

K. S. Tarneja et al, *J. Electrochem. Soc.*, vol. 131, pp. 2438-2441 (1984).

*Primary Examiner*—Aaron Weisstuch
*Attorney, Agent, or Firm*—Pandiscio & Pandiscio

[57] ABSTRACT

A terminal connection for a solar cell device includes a conductive terminal strip protruding from the rear wall of the device and provided with a hole. An insulating convex/concave member is secured to the rear wall and is provided with an aperture which is positioned so that the hole in the strip extends across the aperture. The terminal strip extends between the insulating member and a nut received by the insulating member, with the nut being captured between the insulating member and the rear wall of the solar cell device. A connector member having a metal tube which is forged into electrical and mechanical connection with an exposed portion of a cable core is mechanically fastened to the terminal strip by a fastener which is screwed into the nut, whereby the terminal strip makes electrical contact between the cable and the solar device.

20 Claims, 4 Drawing Sheets

CABLE INTERCONNECTIONS FOR SOLAR CELL MODULES

This invention relates to the production of photovoltaic solar cell devices and more particularly to an improved method of making terminal connections to solar cell modules and solar panels.

BACKGROUND OF THE INVENTION

Photovoltaic solar cells, typically made of silicon, are used to generate electrical energy from incident solar radiation. Typically, a plurality of solar cells are assembled and interconnected so as to form a physically-integrated module, and then a number of such modules are assembled together to form a solar panel. Several solar panels may be connected together to form a larger array. The individual photovoltaic cells in a module may be connected in series or parallel, typically by an internal wiring arrangement and similarly two or more modules in a panel may be connected in series or parallel, depending upon the voltage output desired. In the case where several modules are to be interconnected, and also in the case where two or more solar panels are to be interconnected, external terminals are required for connections to cables that couple the modules or panels together.

A number of different approaches have been tried for the purpose of facilitating external cable interconnection of solar modules and panels. By way of example, but not limitation, U.S. Pat. No. 4,239,555, issued Dec. 16, 1980 to Ronald S. Scharlack for "Encapsulated Solar Cell Array" shows one approach to the problem.

Prior external cable interconnection schemes suffer from one or more of the following problems: inability to assure that the cable connections are water-tight, lack of reliability, excess costs, and high voltage drops.

OBJECTS OF THE INVENTION

The primary object of this invention is to provide a new and improved arrangement for interconnecting solar modules and/or solar panels.

A more specific object of the invention is to provide a novel arrangement for providing cable connections between a plurality of solar modules.

Still another object of the invention is to provide a new and improved terminal connector structure for solar modules and solar panels.

A further object of the invention is to provide a terminal connection for a solar cell apparatus which is adapted to be coupled to a sealed cable connector by means of a screw fastener.

The foregoing objects, as well as other objects hereinafter set forth or rendered obvious, are achieved by providing solar modules that have (+) and (−) terminals in the form of flat copper conductors that protrude from the rear skin of the module and which are attached to and concealed by terminal connector assemblies that are secured to the rear surface of the solar module. Each connector assembly comprises a connector member having means adapted to receive and make a screw connection with a threaded fastener or stud that is used to secure a sealed connector on an insulated cable to the connector assembly, so as to make a secure and low resistance electrical connection between the solar module and the attached cable. Preferably the sealed connector on the attached cable is provided with a cap which is adapted to make a snap fit with a portion of the housing of the sealed connector so as to conceal and provide a water-tight seal for the threaded fastener or stud used to secure the cable to the solar module connector assembly. The cable may have either an end sealed connector or an in-line sealed connector, with an in-line sealed connector being used when the solar module is to be connected between two other solar modules.

Other features and many of the attendant advantages of the invention are hereinafter described or rendered obvious by the following detailed specification and the accompanying drawings relating to a preferred embodiment of the invention.

THE DRAWINGS

DESCRIPTION OF PREFERRED EMBODIMENT OF INVENTION

As used herein, the term "photovoltaic solar cell" means a single solar cell which preferably is a silicon device but also may be some other kind of solar cell known to persons skilled in the art, e.g., a gallium arsenide or a cadmium telluride solar cell. By way of example but not limitation, the solar cell may be manufactured according to the procedures described and illustrated in U.S. Pats. Nos. 4,751,191, 4,451,969, and U.S. Pat. No. 4,152,824, or by K. S. Tarneja et.al., "Investigation Of Liquid Dopants For The Production Of High Efficiency Solar Cells From Dendritic Web Silicon", *J. Electrochem. Soc.*, Vol 131, 10, pp. 2438–2441, Oct. 1984.

As used herein, the term "solar module" means an apparatus comprising a plurality of photovoltaic solar cells arranged in a common plane and hermetically encased in front and back "skins", with the front skin being transparent to solar radiation. The several solar cells in the module may be connected in parallel and/or series, depending upon the desired voltage output for the module. Each module comprises a positive (+) and negative (−) terminal, whereby the module may be connected via cable means to one or more other modules.

As used herein, the term "solar panel" is intended to describe an assembly of a plurality of solar modules arranged so as to form a single physically integrated panel. In the panel, the several modules may be interconnected in series or parallel by cable connections as provided by this invention, and the panel may be connected in turn via cable means to the panel itself having (+) and (−) terminals for directly or indirectly to a power utilization site.

Figure 1:
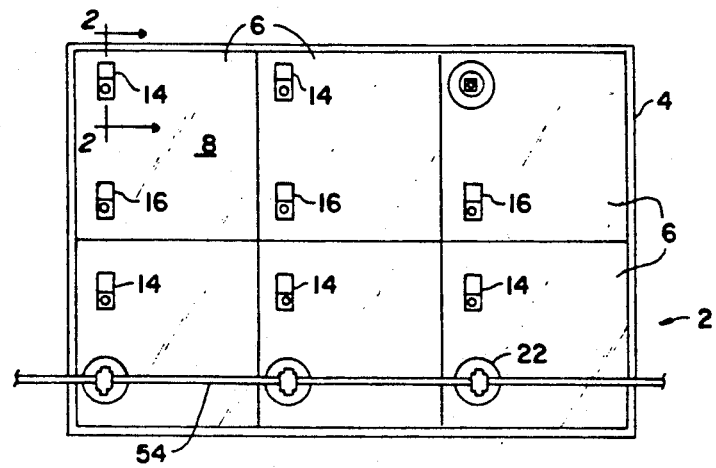
FIG. 1 is a rear view in elevation of a solar panel comprising a plurality of photovoltaic modules.

Referring now to FIG. 1, there is illustrated schematically the rear side of a solar panel 2 comprising a frame 4 in which is mounted a plurality of photovoltaic modules 6 each consisting of a plurality of solar cells aligned in a common plane. All of the modules 6 are aligned in a common plane within frame 4.

Figure 2:
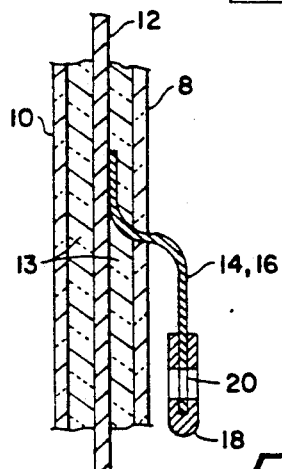
FIG. 2 is a cross-sectional view of a module taken along line 2—2 of FIG. 1.

Referring now to FIGS. 1 and 2, each solar cell module comprises a rear skin 8, a front skin 10 and a plurality of solar cells, one of which is represented schematically at 12 encased in a transparent plastic encapsulant 13, that are interconnected to provide a selected voltage output. The rear skin 8 is preferably made of a stiff weatherable heat-conductive material, e.g., a pigmented sheet of a polyvinyl fluoride or an acrylic or polycarbonate resin or an opaque coated glass sheet, while the front skin 10 is transparent and may be made of glass or a suitable plastic such as an acrylic or polycarbonate resin.

The interconnection of the several cells that make up a module 6 is achieved by suitable conventional means. The exact means used to interconnect the cells in an individual module are not critical to the present invention, except that for this invention each of the modules is provided with a pair of flexible terminal strips or leads 14 and 16 that protrude through the rear skin 8 of the module. For sake of clarity and convenience, the terminal strips 14 may be identified as the positive (+) terminals and the terminal strips 16 may be identified as the negative (−) terminals for each module. Each strip 14 and 16 is preferably made of a flat copper ribbon and the free end of strip 14 or 16 is encased in a U-shaped copper reinforcing member 18, with each strip 14 and 16 and the associated reinforcing tab 18 having aligned holes 20 to accommodate a screw-type fastener or stud used as hereinafter described to connect one side of each module to a sealed cable connector. In accordance with this invention, means are provided, in association with terminal strips 14 and 16, for interconnecting the modules to one another and also to modules in other solar panels or to a utilization terminal, such as a power grid or the circuit for a building on which the solar modular panel is mounted.

In accordance with this invention, each of the terminal strips 14 and 16 is adapted for connection to an insulated power cable by means of a connector assembly that comprises a plastic terminal block that preferably is in the form of a circular disk 22 (FIGS. 3-5 and 10). Preferably, but not necessarily, disk 22 is made of a thermoplastic material. As seen best in FIGS. 3-5 and 10, disk 22 is provided with a generally convex/concave cross-sectional configuration, having a conical or concave/convex annular body portion 24 that has a raised collar 26 on its front side that is surrounded by a flat annular surface 28 that functions as a shoulder. Annular collar 26 surrounds a rectangular aperture or hole 30 located at the center of the disk. The rear side of the disk is provided with a raised hexagonally configured wall 32, with one of the sides of the hexagon being omitted so as to provide an opening 33 for one of terminal strips 14 or 16. Preferably but not necessarily, a plurality of ribs 34 are formed as shown on the rear side of the disk so as to strengthen it against deflection or bowing. The rear side of the disk has a flat annular surface 38 at its edge for the purpose of assuring that the disk will be seated flat against the rear skin of the associated solar module.

Figure 3:
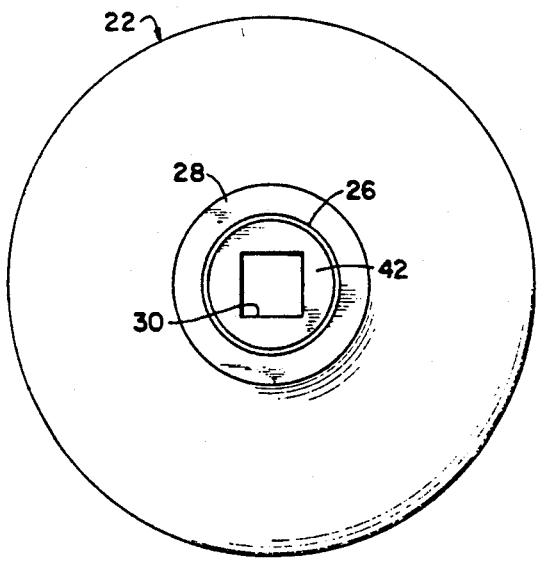
FIG. 3 is a front view of a connector disk provided according to the present invention.
Figure 4:
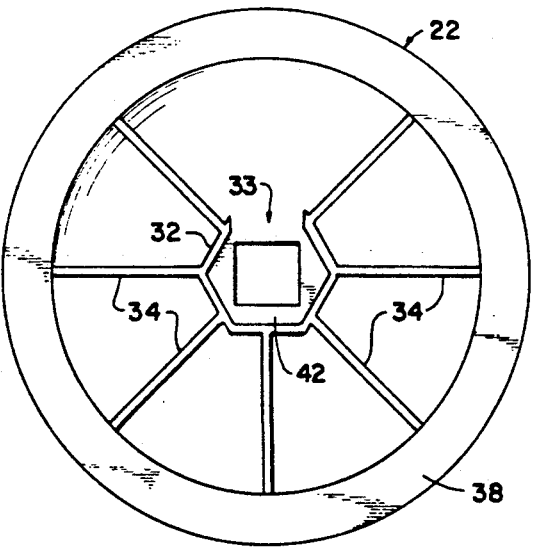
FIG. 4 is a rear view of the same disk.
Figure 5:
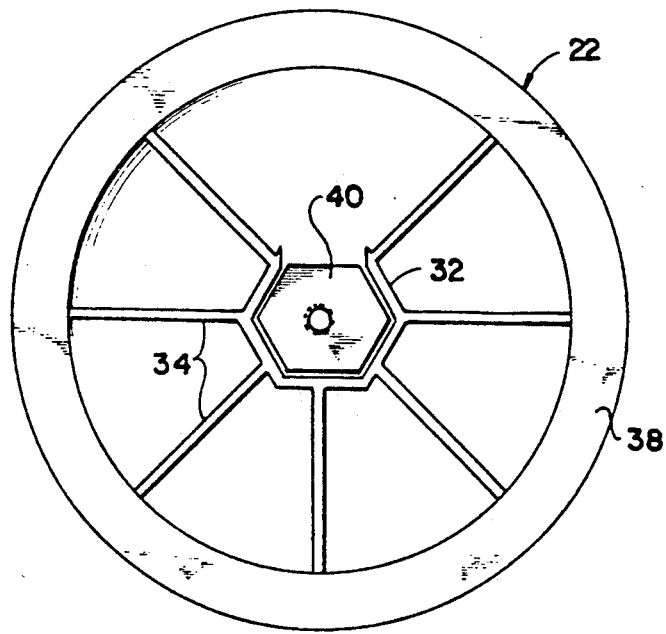
FIG. 5 is a rear view like FIG. 4 but showing a nut engaged with the disk.

A hexagonal threaded nut 40 is received in the hexagonally-shaped depression defined by the hexagonally-shaped wall 32, as shown in FIG. 5. Nut 40 has a front rib 41 that is sized to fit in the opening 20 of reinforcement 18 (see FIG. 10). Hexagonal wall 32 prevents rotation of the nut 40. The thickness of the nut is selected so that the nut does not project beyond the plane of the flat annular surface 38 of disk 22 when the nut is in place in the recess defined by the hexagonal wall 32. Preferably the thickness of the nut is selected so that when the strip 14 or 16 is interposed between the nut and disk 22, as hereinafter described, both nut 22 and surface 38 engage rear skin 8. Referring now to FIGS. 3 and 4, the center section 42 of the disk that defines the square opening 30 serves to capture the nut between the disk and the rear wall of the solar module when the disk is attached to the module. The disk is cemented to the rear skin 8 of the associated module by a suitable cement (not shown). Preferably a silicone RTV or an epoxy cement is used which will assure an hermetic seal between the disk and the solar module, while at the same time assuring that a strong permanent bond exists between the disk and the solar panel sufficient to assure that nut 40 will not move relative to rear skin 8.

Figure 10:
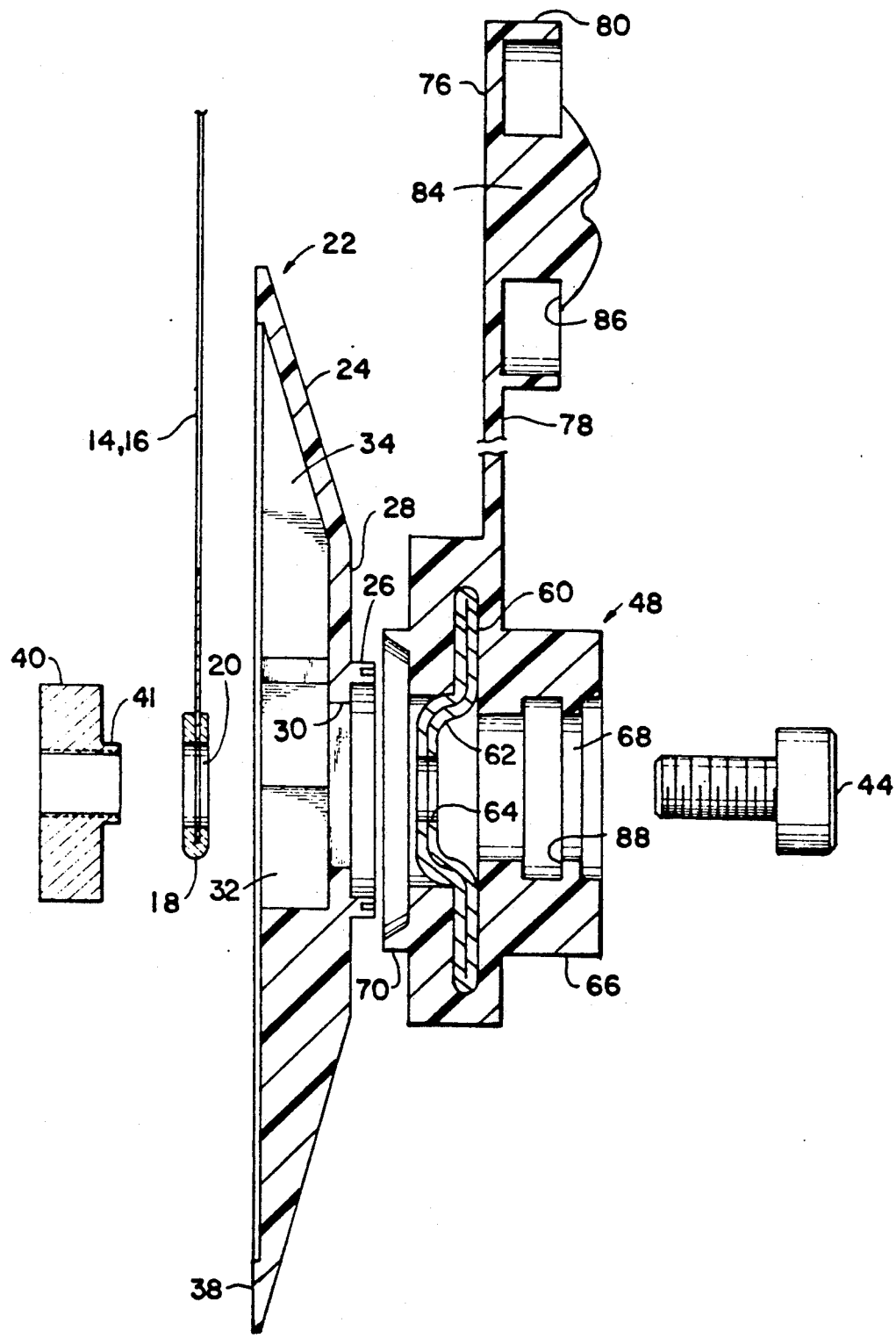
FIG. 10 is an exploded cross-sectional view taken along a line corresponding to line 10—10 of FIG. 6 showing the various components of the terminal structure.

Disk 22 is attached to the rear skin of the solar module by first removing the nut and inserting one of the terminal strips 14 and 16 into the opening 33 between the nut and the disk, so that the openings 20 in the reinforcing tab 18 and the associated terminal strip 14 or 16 are aligned with the center hole of the nut. The disk is then cemented to the rear side of the module, thereby capturing the terminal strip 14 or 16 between the disk and nut 40, with the nut itself being captured between the disk and rear skin 8, as shown in FIG. 10. Once this has been done, the module is ready for connecting to a cable for interconnecting the module with adjacent modules or an electrical energy utilization device or system.

Turning now to FIGS. 6-10, the invention makes use of insulated cables having stud-type sealed connectors adapted to be connected to nuts 40 by means of suitable threaded studs 44 (FIG. 10). Cables with stud-type sealed connectors are well known in the art, being commonly used for connecting batteries to a utilization terminal or to other batteries. Depending on the location of the module being connected, the cables may have stud-type end sealed connectors of the kind commonly found on the ends of cables for automobile batteries or stud-type in-line sealed connectors designed to provide an intermediate in-line connection of one module to two other modules.

FIGS. 6-10 illustrate a stud-type in-line sealed connector 48 that is adapted for use with the present invention. An insulated cable 54 is coupled to in-line stud-type sealed connector 48. The in-line connector 48 may be made in various ways known to persons skilled in the art, e.g., it may be made in accordance with the procedures described in U.S. Pat. No. 4,325,760, issued Apr. 20, 1982 to Victor J. Julian et.al. for "Method Of Making A Cable Splice", and U.S. Pat. No. 4,049,335, issued Sept. 20, 1977 to Victor J. Julian et.al. for "Sealed Battery Threaded Stud-Termination". Essentially a cable 54 having a stranded metal core 56 encased in a tubular layer of insulation 58 has a portion of the insulation removed to expose a portion of the core 56, and a metal tube or sleeve is slipped over the exposed portion of the cable and then flattened into compressive relation with the core so as to form a forged member 60 (FIG. 9) that is core, and a hole 64 is punched through the flattened tube 60 and the core encased therein for receiving a threaded stud. Then a cover of plastic or rubber is molded over the tube and the adjacent ends of the cable insulation.

Figure 8:
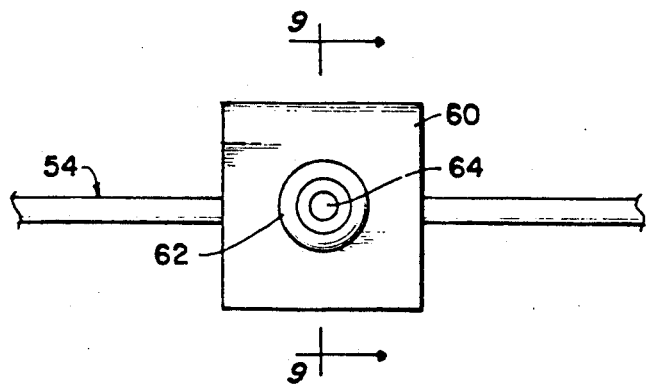
FIG. 8 is a fragmentary plan view of the in-line sealed connector of FIGS. 6 and 7 with the connector covering removed so as to illustrate the cable connections.
Figure 9:
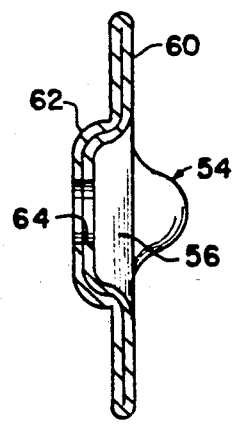
FIG. 9 is a cross-sectional view taken along line 9—9 of FIG. 9.

FIGS. 8 and 9 illustrate the shape of the metal tube 60 after it has been forged into electrical and mechanical connection with the previously exposed portion of the core 56 of cable 54. The flattened tubular member has an offset portion 62 defining an opening 64. The forged tubular metal member 60 is encased in a molded electrically insulating cover or housing 66 made of plastic or rubber. The molded housing overlaps and is bonded to the insulation 58 of the cable. A seen in FIG. 7 molded housing 66 is formed with a central aperture 68 through which the offset portion 62 of the forged metal tubing is visible.

Figure 6:
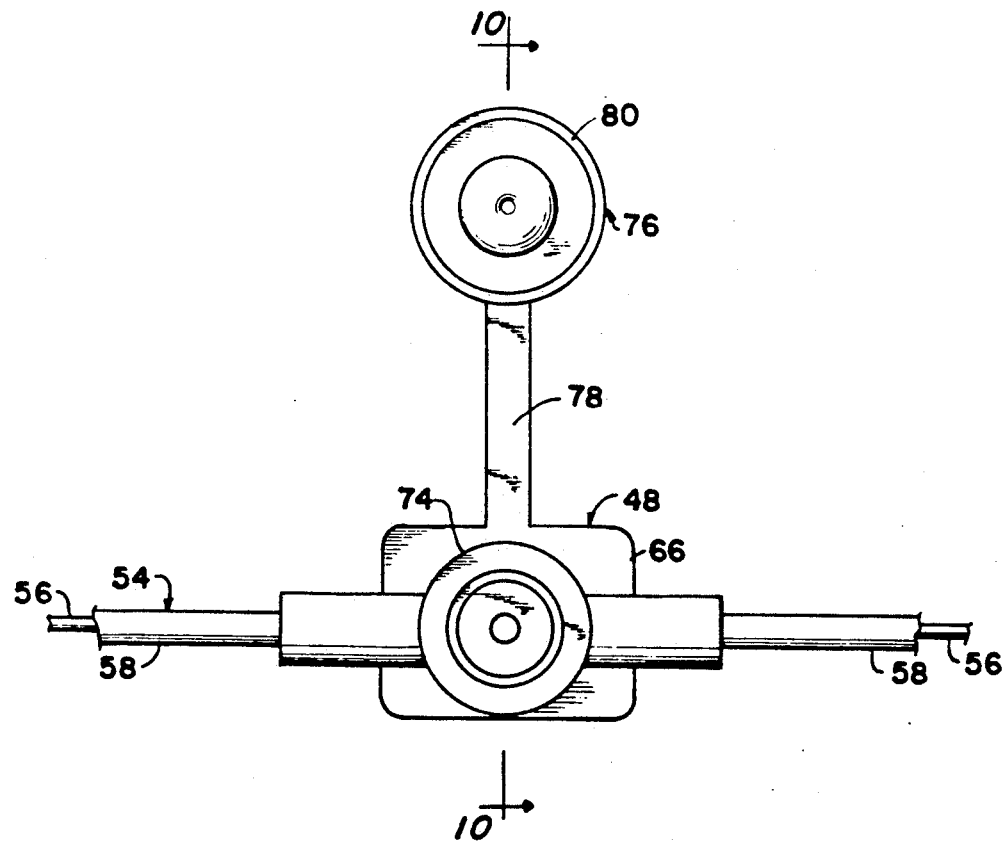
FIG. 6 is a front view (as seen in FIGS. 1 and 7) of an in-line sealed cable connector as utilized in connecting modules as shown in FIG. 1.
Figure 7:
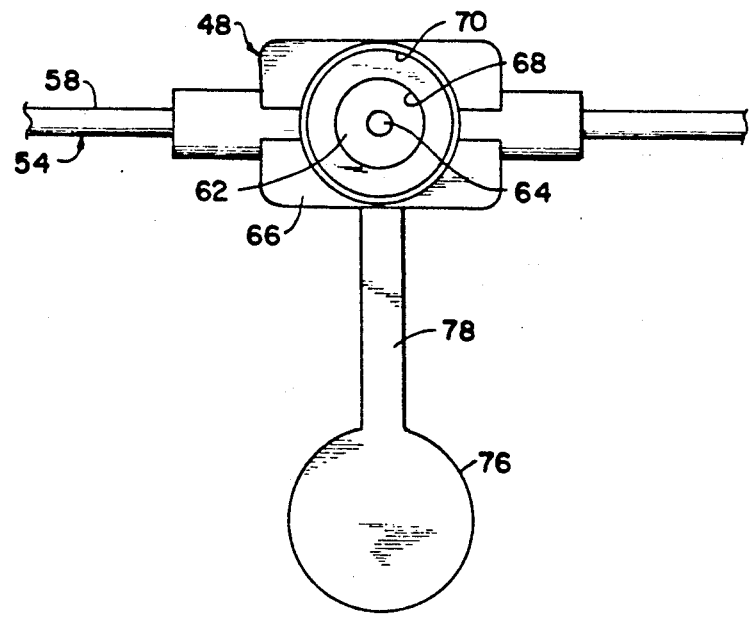
FIG. 7 is a rear view of the same in-line sealed connector and cable.

One side of housing 66 is flat except for a resilient annular rib 70 that is provided to make a resilient seal to the rear skin of the module. The other side of housing 66 as shown in FIG. 6 is provided with a cylindrical portion 74 that is adapted to make a snap fit connection with a cap 76 that is coupled to the housing by a flexible strip 78. Cap 76 has a cylindrical side wall 80 plus a center hub section 84 which has a peripheral lip 86 adapted to make a snap fit with an internal rib 88 in the center aperture of housing 66.

The insulated stud in-line sealed connector 48 is attached to the nut 40 by means of a screw or stud 44 (FIG. 10). Screw 44 extends through aperture 64 in the offset portion 62 of the metal connector member, and also through the opening 20 in the reinforcement 18 of a strip 14 or 16, and is screwed into the nut 40, thereby making a secure electrical connection.

As is evident from FIG. 1, a cable with a number of in-line sealed connectors of the type described may be used to interconnect all of the modules in solar panel, as well as being used to interconnect one solar panel with another. In FIG. 1, only a single cable 54 is shown connected to the negative terminal strips 14 of one row of modules in the solar panel 2. The corresponding terminals of the remaining modules may be connected by a second cable, with those two cables then being connected together as desired. Similarly, the positive terminal strips 16 of each row of modules may be connected together by another cable like cable 54 having in-line sealed connectors as above-described.

A most important advantage of the present invention is that the interconnect scheme provides low profile connections. This is very important, particularly when it is considered that in the preferred embodiment of the invention, the distance between the front surface of collar 26 and the annular surface 38 of the disk is approximately 0.25 inch. Additionally, the invention offers other advantages: (1) the interconnect scheme has a relatively low cost, since the attachment of the terminal disks 22 to the rear sides of the modules in electrical connection with the tabs 14 and 16 is easy to accomplish; and (2) the invention provides water-tight cable connections, as well as low voltage drops, high conductivity and reliability at the output device/cable connection.

The invention also offers the further advantage that detachment of the cables from a solar module for the purpose of inspection or repair is easily accomplished, detachment requiring simply the unscrewing of the screws 44 to release the cables from the solar panel.

Other advantages of the invention will be obvious to persons skilled in the art.

It is to be appreciated also that the invention is subject to certain obvious modifications. Thus, the particular shape of the plastic disks, the manner in which the nuts 40 are associated with the disks, and the manner in which the disks are attached to the photovoltaic modules, etc. may be changed without loss of the above-described advantages of the invention. Also the cable may have a stud-type end connection instead of a stud-type in-line connector.

Therefore, the invention is to be deemed limited only by the terms of the appended claims.

What is claimed is:

1. In combination with a photovoltaic solar cell device having a rear wall and a conductive terminal strip protruding from said rear wall and having a hole therein, a member made of an insulating material secured to said rear wall, said member having an aperture and being positioned so that said hole in said terminal strip extends across said aperture, and a nut capturing said strip to said member so as to provide an electrical connection with said strip, said nut having a threaded hole accessible through said aperture to receive a threaded hole accessible through said aperture to receive a threaded fastener for securing said strip to an electrical cable.

2. Apparatus according to claim 1 wherein said member is a disk made of plastic.

3. Apparatus according to claim 2 wherein said disk is circular and has a convex/concave profile in cross-section.

4. Apparatus according to claim 3 wherein said disk has a shallow profile, having a diameter greatly in excess of its thickness.

5. Apparatus according to claim 3 wherein said disk is made of a thermoplastic material 6. Apparatus according to claim 5 wherein said disk is resilient.

7. Apparatus according to claim 1 further including a cable with a sealed stud-type connector, and a threaded fastener for securing said connector to said nut.

8. A photovoltaic solar cell device having a rear surface, a conductive terminal strip for said solar cell device, said strip having a portion protruding from said rear surface and said protruding portion having a hole therein, a member made of an insulating material secured to said rear surface, said member having front and rear sides and an aperture, and also being positioned so that said hole in said strip extends across said aperture, a nut capturing said strip between said nut and said member, said nut having a threaded hole accessible through said aperture, an electrical cable having a stud-type sealed connector engaged with the rear side of said member, and a threaded stud extending through said stud-type sealed connector and engaged with said threaded hole so as to secure and electrically couple said strip t said cable.

9. Apparatus according to claim 8 wherein said connector is a through connector.

10. Apparatus according to claim 8 wherein said connector is an end connector.

11. Apparatus according to claim 8 wherein said member is a disk made of plastic.

12. Apparatus according to claim 11 wherein said disk is circular and has a convex/concave profile in cross-section.

13. Apparatus according to claim 11 wherein said disk has a shallow profile

14. Apparatus according to claim 8 wherein said solar cell device is made of silicon.

15. A photovoltaic solar cell device having a rear surface, a conductive terminal strip for said solar cell device, said strip having a portion protruding from said rear surface and said proturiding portion having a hole therein, a member made of an insulating material secured to said rear surface, said portion of said strip being captured between said member and said rear surface, a connector member in electrical and mechanical connection with an electrical cable and being provided with an opening, said opening being so positioned that said hole in said terminal strip is positioned in line therewith, and fastener means including means extending through said hole, said opening and said member made of insulating material for fastening said connector member to said terminal strip whereby said cable and solar cell device are placed in electrical connection with one another.

16. Apparatus according to claim 15 wherein said member of insulating material is a disk made of plastic.

17. Apparatus according to claim 16 wherein said disk is circular and has a convex/concave profile in cross-section,.

18. Apparatus according to claim 17 wherein said disk is made of a thermoplastic material.

19. Apparatus according to claim 18 wherein said disk is resilient.

20. Apparatus according to claim 16 wherein said disk has a shallow profile, having a diamter greatly in excess of its thickness.

* * * * *

UNITED STATES PATENT AND TRADEMARK OFFICE
CERTIFICATE OF CORRECTION

PATENT NO. : 5110369
DATED : May 5, 1992
INVENTOR(S) : Eric Tornstrom et al

It is certified that error appears in the above-identified patent and that said Letters Patent is hereby corrected as shown below:

Claim 1, column 6, lines 27 and 28, delete the phrase "threaded hole accessible through said aperture to receive a";

Claim 5, column 6, line 39, add a period after "material";

Claim 8, column 6, line 62 "t" should be -- to --;

Claim 13, column 7, line 5, add a period after "profile";

Claim 15, column 7, line 11, "proturiding" should be -- protruding --; and

Claim 17, column 8, line 10, delete the comma after "cross-section".

Signed and Sealed this

Third Day of August, 1993

Attest:

MICHAEL K. KIRK

*Attesting Officer*   Acting Commissioner of Patents and Trademarks